(12) United States Patent
Shiao et al.

(10) Patent No.: US 9,442,161 B2
(45) Date of Patent: Sep. 13, 2016

(54) DETECTOR DEVICE FOR FUNCTIONAL CERTIFICATION

(71) Applicant: National Applied Research Laboratories, Taipei (TW)

(72) Inventors: Yu-Shao Shiao, Hsinchu (TW); Guo-Wei Huang, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 224 days.

(21) Appl. No.: 14/477,279

(22) Filed: Sep. 4, 2014

(65) Prior Publication Data
US 2016/0069952 A1    Mar. 10, 2016

(51) Int. Cl.
*G01R 31/308*  (2006.01)
*G01R 31/311*  (2006.01)
*G01R 31/302*  (2006.01)
*G01R 1/24*  (2006.01)
*G01R 1/07*  (2006.01)

(52) U.S. Cl.
CPC .......... *G01R 31/311* (2013.01); *G01R 31/302* (2013.01); *G01R 1/071* (2013.01); *G01R 1/24* (2013.01)

(58) Field of Classification Search
CPC .......... G01R 1/071; G01R 1/24; G01R 1/67; G01R 1/6744; G01R 31/302; G01R 31/308; G01R 31/311; G01R 31/2656; G01R 31/2648; G01R 31/2831
See application file for complete search history.

(56) References Cited

U.S. PATENT DOCUMENTS

| | | | |
|---|---|---|---|
| 4,871,964 A | 10/1989 | Boll et al. | |
| 5,101,453 A | 3/1992 | Rumbaugh | |
| 5,373,231 A | 12/1994 | Boll et al. | |
| 7,082,230 B2 * | 7/2006 | Huang | G01R 29/0885 324/96 |
| 7,495,461 B2 | 2/2009 | Hayden et al. | |
| 7,759,953 B2 | 7/2010 | Strid et al. | |
| 2010/0170016 A1 * | 7/2010 | Schilling | B23K 37/047 850/21 |
| 2013/0106456 A1 | 5/2013 | Weikle et al. | |

OTHER PUBLICATIONS

Faycal Touati et al., "On-Chip integration of dipole antenna and VCO using standard BiCMOS technology for 10 GHz applications", Sep. 2003.
Qiang Yu et al., "Improved Micromachined Terahertz On-Wafer Probe Using Integrated Strain Sensor", IEEE Transactions on Microwave Theory and Techniques, vol. 61, No. 12, Dec. 2013.
Matthew Bauwens et al., "A Terahertz Micromachined On-Wafer Probe for WR-1.2 Waveguide", Oct. 2012.

* cited by examiner

*Primary Examiner* — Minh N Tang
(74) *Attorney, Agent, or Firm* — WPAT, PC; Justin King

(57) ABSTRACT

A detector device for functional certification includes a probe, a waveguide and a first micro-antenna. The probe includes a tip portion and a through-portion, wherein an end of the through-portion penetrates a first surface of the probe to form a first opening, and an opposite end of the through-portion penetrates the tip portion to form a second opening. The waveguide is disposed in the through-portion. The first micro-antenna is installed in the second opening and electrically connected with the waveguide.

20 Claims, 9 Drawing Sheets

US 9,442,161 B2

DETECTOR DEVICE FOR FUNCTIONAL CERTIFICATION

FIELD OF THE INVENTION

The invention relates to a detector device, and more particularly to a detector device for functional certification.

BACKGROUND

A conventional method for detecting high frequency integrated circuit (IC) chip is in direct contact with chip pads by using an on-wafer probe. In the detecting process, RF signals are transmitted from a tip of the on-wafer probe to a cable of detecting equipment electrically connected to the on-wafer probe. However, the detecting method by using the on-wafer probe will make the RF signals lose more and more in detecting higher frequency IC chips. Meanwhile, with the high frequency IC chip modeled at THz, 300-3000 GHz, the unstable characteristics of the chip pads will make IC design and measurement become more difficult.

In order to solve the above-mentioned problems, integrating an on-chip antenna on the IC chip is proposed. A contactless detecting equipment must be used in detecting the IC chip with the on-chip antenna. However, conventional contactless detecting equipment is huge and only one chip pad can be measured in each detecting process. Besides, since a distance between the conventional contactless detecting equipment and the chip pad is too long, the measured data is always not accurate enough.

In view of the aforementioned reasons, there is a need to provide an improved detector device to solve the above mentioned problems.

SUMMARY

The embodiment provides a detector device for functional certification, so as to certify devices such as IC chips with an enhanced accuracy.

In order to achieve the aforementioned advantages or other merits, a detector device for functional certification is provided in an embodiment. The detector device includes a probe, a waveguide, and a first micro-antenna. The probe includes a tip portion and a through-portion, wherein an end of the through-portion penetrates a first surface of the probe to form a first opening, and an opposite end of the through-portion penetrates the tip portion to form a second opening. The waveguide is disposed in the through-portion. The first micro-antenna is installed in the second opening, wherein the horn micro-antenna is electrically connected with the waveguide.

In summary, the detector devices according to the embodiment have at least one micro-antenna installed in an opening of the tip portion of the probe. The detector devices according to the embodiment can be used for detecting an on-wafer antenna of the IC chip more closely. Therefore, a relatively high accuracy can be obtained. The detector devices according to the embodiment could be integrated in a conventional probe stage.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The embodiment will become more readily apparent to those ordinarily skilled in the art after reviewing the following detailed description and accompanying drawings, in which.

DETAILED DESCRIPTION OF PREFERRED EMBODIMENTS

The embodiments will now be described more specifically with reference to the following embodiments. It is to be noted that the following descriptions of preferred embodiments are presented herein for purpose of illustration and description only. It is not intended to be exhaustive or to be limited to the precise form disclosed.

Figure 1A:
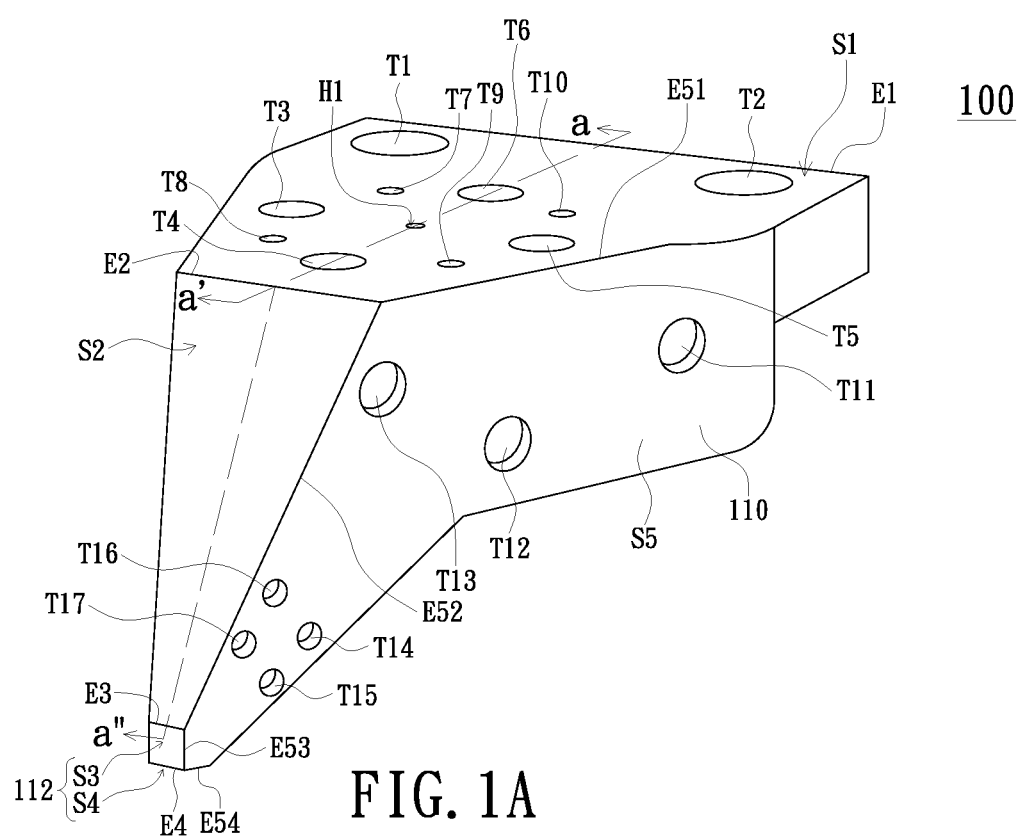
FIG. 1A is a schematic block diagram illustrating a detector device according to an embodiment.
Figure 1B:
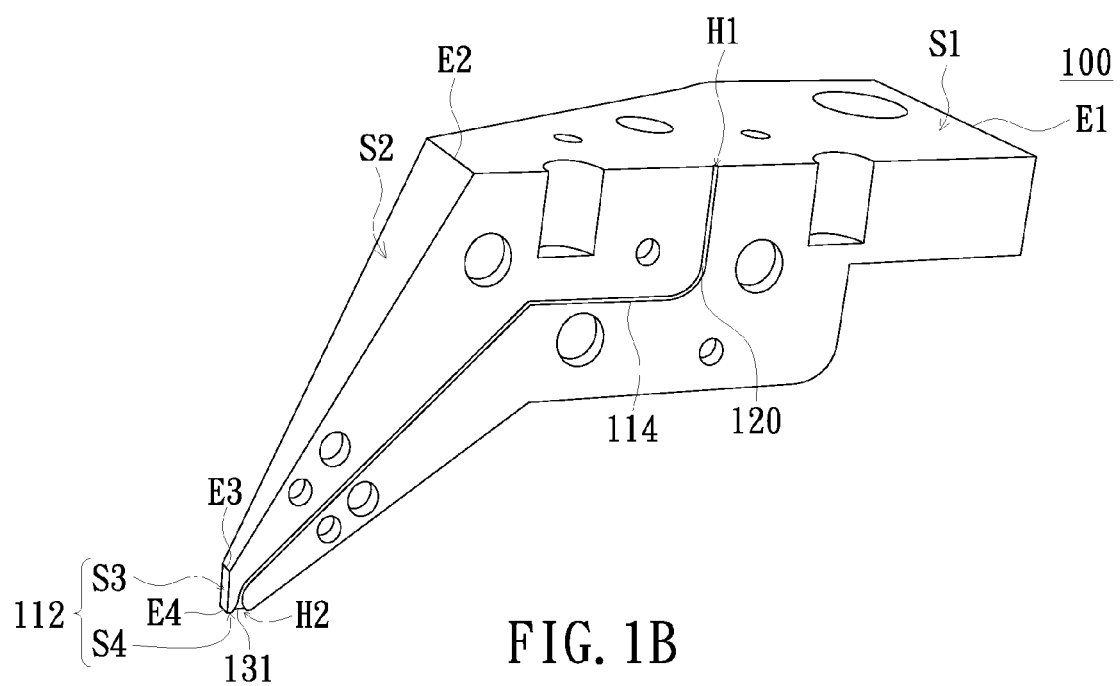
FIG. 1B is a schematic cross-sectional view taken along line a-a'-a" in FIG. 1A, wherein the symbol "a" is a center of a first edge, the symbol "a'" is a center of a second edge, the symbol "a''" is a center of a third edge.

FIG. 1A is a schematic block diagram illustrating a detector device 100 according to an embodiment. FIG. 1B is a schematic cross-sectional view taken along line a-a'-a" in FIG. 1A, wherein the symbol "a" is a center of a first edge, the symbol "a'" is a center of a second edge, the symbol "a''" is a center of a third edge. Please referring to FIGS. 1A~1B, the detector device 100 includes a probe 110, a waveguide 120, and a first micro-antenna 131. In this embodiment, the first micro-antenna 131 is a horn micro-antenna and used for transmitting signals to on-wafer antennas of IC chips or receiving signals from on-wafer antennas of IC chips at THz frequencies, wherein the horn micro-antenna has a size of about 1 mm×1 mm, or in another embodiment, the horn micro-antenna has a size of about several millimeters× several millimeters. The detector device 100 can be used for contactless detection or functional certification of devices such as IC chips.

The probe 110 includes a first surface S1, a second surface S2, a third surface S3, a fourth surface S4, a tip portion 112, and a through-portion 114. The waveguide 120 is disposed in the through-portion 114. The third surface S3 and the fourth surface S4 are corporately formed as the tip portion 112. An end of the through-portion 114 penetrates a first surface S1 of the probe 110 to form a first opening H1, and an opposite end of the through-portion 114 penetrates the fourth surface S4 of the tip portion 112 to form a second opening H2. The first opening H1 and the second opening H2 have opposite directions. The first micro-antenna 131 is installed in the second opening H2 and electrically connected with the waveguide 120.

In addition, the first surface S1 has a first edge E1 and a second edge E2 opposite to the first edge E1. The second surface S2 has the second edge E2 and a third edge E3 opposite to the second edge E2. The first surface and the second surface jointly have the second edge E2. The first edge E1 is longer than the second edge E2, and the second edge E2 is longer than the third edge E3. The third surface S3 and the second surface S2 jointly have the third edge E3. The third surface S3 and the fourth surface S4 jointly have a fourth edge E4 opposite to the third edge E3. The first surface S1 and the fourth surface S4 have the same extending direction.

Furthermore, the probe further includes a side surface S5 and a plurality of screw holes T1~T17, wherein the screw holes T1~T10 are arranged inside the first surface S1, the screw holes T11~T17 are arranged inside the side surface S5, wherein the side surface S5 and the first surface S1 jointly have the edge E51, the side surface S5 and the second surface S2 jointly have the edge E52, the side surface S5 and the third surface S3 jointly have the edge E53, the side surface S5 and the fourth surface S4 jointly have the edge E54. The screw holes T1 and T2 are adjacent to the first edge E1. The screw holes T3~T10 are arranged in a circle array. The screw holes T14~T17 are arranged in a rectangular array with up to 2 rows and up to 2 columns, wherein the rectangular array is adjacent to the tip portion 112.

Figure 2:
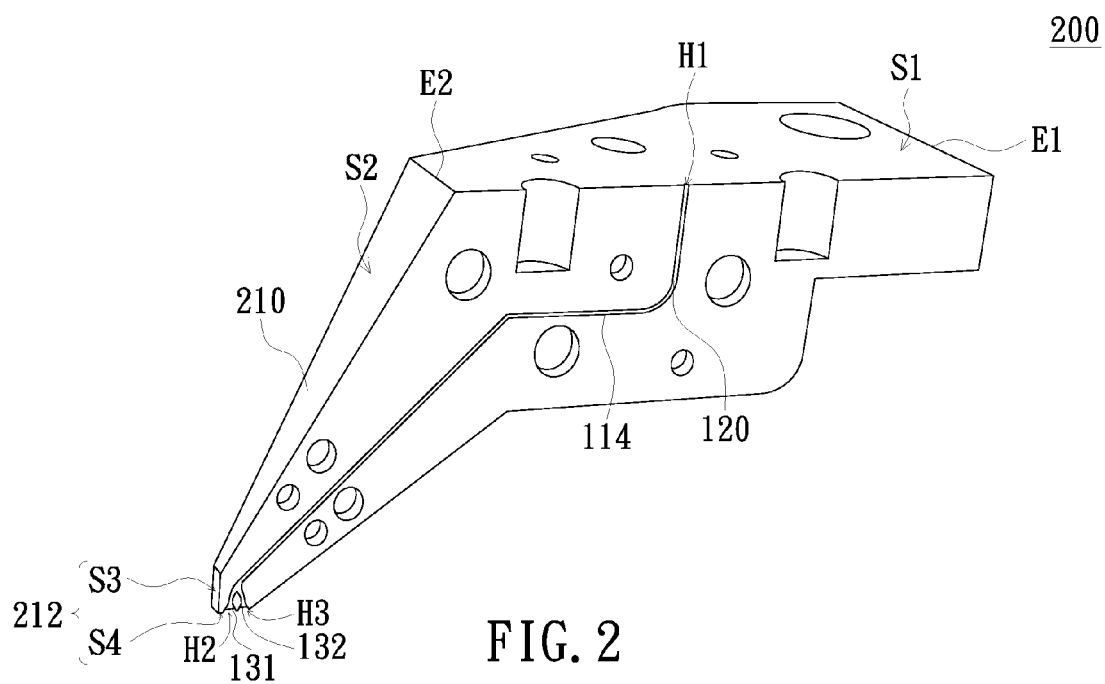
FIG. 2 is a schematic cross-sectional view illustrating a detector device according to another embodiment.

FIG. 2 is a schematic cross-sectional view illustrating a detector device 200 according to another embodiment. Referring to FIG. 2. In this embodiment, the detector device 200 includes not only the first micro-antenna 131 of the detector device 100, but also a second micro-antenna 132.

The detector device 200 includes a probe 210, the waveguide 120, the first micro-antenna 131 and a second micro-antenna 132. In this embodiment, the first micro-antenna 131 and the second micro-antenna 132 are horn micro-antennas and used for transmitting signals to on-wafer antennas of IC chips or receiving signals from on-wafer antennas of IC chips at THz frequencies. The detector device 200 can be used for contactless detection or functional certification of devices such as IC chips.

The probe 210 includes a first surface S1, the second surface S2, the third surface S3, the fourth surface S4, a tip portion 212 and the through-portion 114, wherein the third surface S3 and the fourth surface S4 are corporately formed as the tip portion 212. An end of the through-portion 114 penetrates the first surface S1 of the probe 210 to form the first opening H1, and an opposite end of the through-portion 114 penetrates the fourth surface S4 of the tip portion 212 to form the second opening H2 and a third opening H3. The first opening H1 and the second opening H2 have opposite directions. The first opening H1 and the third opening H3 have opposite directions. The second opening H2 and the third opening H3 have the same direction. Usually, the first, second and third openings H1, H2, H3 are square-shaped since a specific direction can be selected. However, if necessary, the first, second and third openings H1, H2, H3 can also be round or in other directions. Also, the first, second, third and fourth surfaces S1, S2, S3, and S4 can be of different designs in accordance with the needs.

The first micro-antenna 131 is installed in the second opening H2, and the second micro-antenna 132 is installed in the third opening H3. The first micro-antenna 131 and the second micro-antenna 132 are separately electrically connected with the waveguide 120. The second opening H2 and the third opening H3 are arranged in a straight line parallel to a horizontal linking line of the first opening H1 to the second opening H2.

It is worth mentioning that the detector device 200 can be used for detecting not only a single on-wafer antenna of the IC chip in each detecting process, but also simultaneously detecting two on-wafer antennas of the IC chip in each detecting process.

Figure 3A:
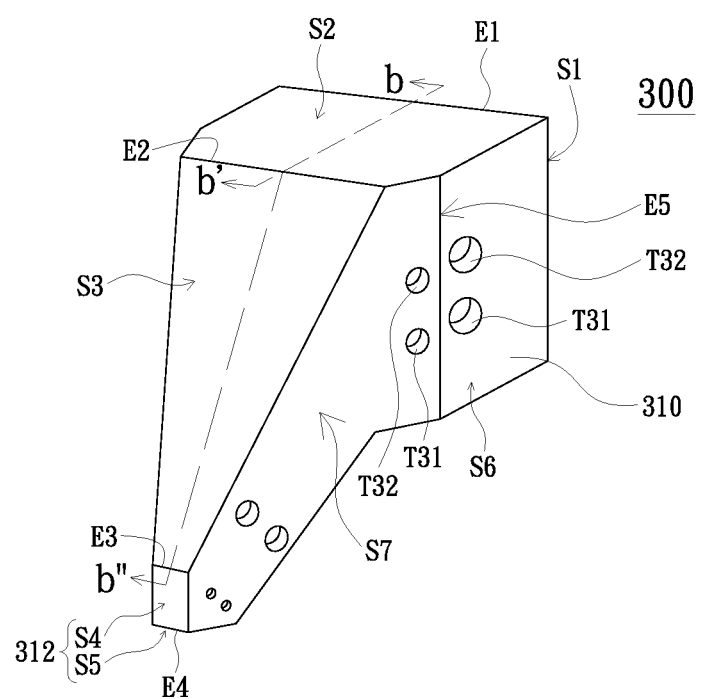
FIG. 3A is a schematic block diagram illustrating a detector device according to an embodiment.
Figure 3B:
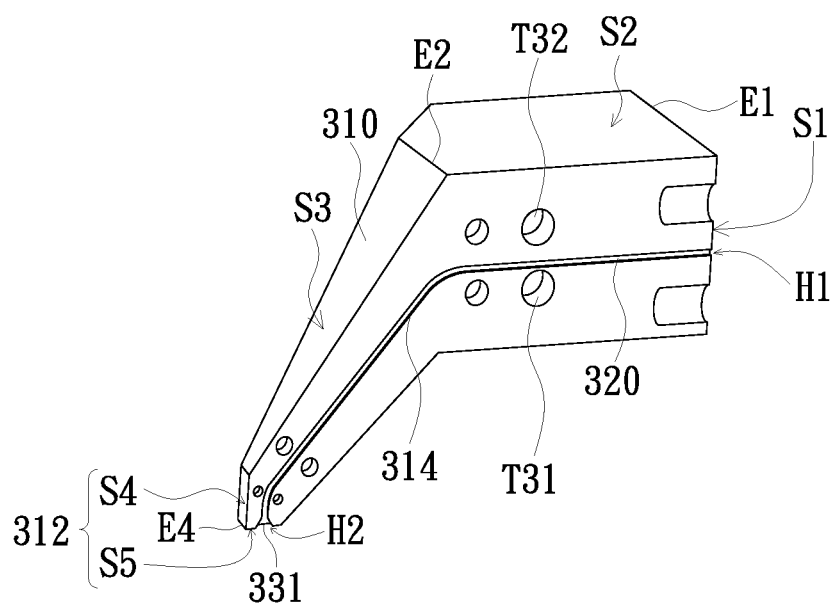
FIG. 3B is a schematic cross-sectional view taken along line b-b'-b" in FIG. 3A, wherein the symbol "b" is a center of a first edge, the symbol "b'" is a center of a second edge, the symbol "b''" is a center of a third edge.

FIG. 3A is a schematic block diagram illustrating a detector device 300 according to an embodiment. FIG. 3B is a schematic cross-sectional view taken along line b-b'-b" in FIG. 3A, wherein the symbol "b" is a center of a first edge, the symbol "b'" is a center of a second edge, and the symbol "b''" is a center of a third edge. Please referring to FIGS. 3A~3B. The detector device 300 includes a probe 310, a waveguide 320, and a first micro-antenna 331. In this embodiment, the first micro-antenna 331 is a horn micro-antenna and used for transmitting signals to on-wafer antennas of IC chips or receiving signals from on-wafer antennas of IC chips at THz frequencies. The detector device 300 can be used for contactless detection or functional certification of devices such as IC chips.

The probe 310 includes a first surface S1, a second surface S2, a third surface S3, a fourth surface S4, a fifth surface S5, a tip portion 312, and a through-portion 314. The waveguide 320 is disposed in the through-portion 314. The fourth surface S4 and the fifth surface S5 are corporately formed as the tip portion 312. An end of the through-portion 314 penetrates a first surface S1 of the probe 310 to form a first opening H1, and an opposite end of the through-portion 314 penetrates the fifth surface S5 of the tip portion 312 to form a second opening H2. The first opening H1 and the second opening H2 have mutually perpendicular directions. The first micro-antenna 331 is installed in the second opening H2 and electrically connected with the waveguide 320.

In addition, the first surface S1 and the second surface S2 jointly have the a first edge E1, the second surface S2 and the third surface S3 jointly have the a second edge E2 opposite to the first edge E1, and the second edge E2 is shorter than the first edge E1. The third surface S3 further have a third edge E3 opposite to the second edge E2, and the third edge E3 is shorter than the second edge E2. The fourth surface S4 and the third surface S3 jointly have the third edge E3, and the fourth surface S4 and the fifth surface S5 jointly have the a fourth edge E4 opposite to the third edge E3, wherein the second surface S2 and the fifth surface S5 have the same extending direction, and the first surface S1 and the second surface S2 have mutually perpendicular extending directions.

Furthermore, the probe further includes a side surface S6, a side surface S7, and a plurality of screw holes T31, T32, wherein the screw holes T31 and the screw holes T32 are arranged side by side inside the side surface S6 and the side surface S7 (as shown in FIG. 3A), and the screw holes T31 and the screw holes T32 are located on both sides of the waveguide 320 (as shown in FIG. 3B). In addition, some of the screw holes T31 and the screw holes T32 are adjacent to the tip portion 312, and some of the screw holes T31 and the screw holes T32 are adjacent to a fifth edge E5; wherein the side surface S6 and a side surface S7 jointly have the fifth edge E5. It should be noted that the positions, shapes and directions of the screw holes T31, T32 can be of different designs in accordance with the needs.

Figure 4:
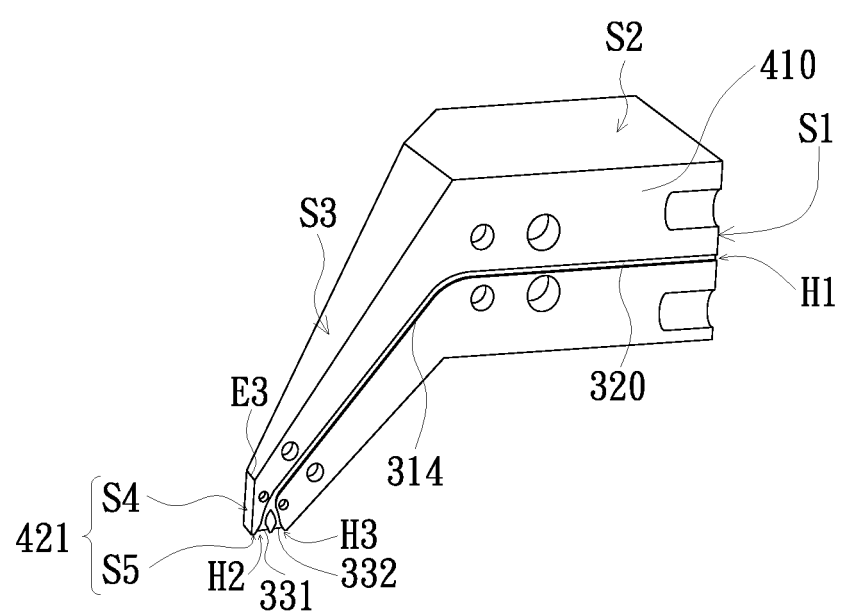
FIG. 4 is a schematic cross-sectional view illustrating a detector device according to another embodiment.

FIG. 4 is a schematic cross-sectional view illustrating a detector device 400 according to another embodiment. Please refer to FIG. 4. In this embodiment, the detector device 400 includes not only the first micro-antenna 331 of the detector device 300, but also a second micro-antenna 332.

The detector device 400 includes a probe 410, the waveguide 320, the first micro-antenna 331, and a second micro-antenna 332. In this embodiment, the first micro-antenna 331 and the second micro-antenna 332 are horn micro-antennas and used for transmitting signals to on-wafer antennas of IC chips or receiving signals from on-wafer antennas of IC chips at THz frequencies. The detector device 400 can be used for contactless detection or functional certification of devices such as IC chips.

The probe 410 includes the first surface S1, the second surface S2, the third surface S3, the fourth surface S4, the fifth surface S5, a tip portion 412, and the through-portion 314, wherein the fourth surface S4 and the fifth surface S5 are corporately formed as the tip portion 412. An end of the through-portion 314 penetrates the first surface S1 of the probe 410 to form the first opening H1, and an opposite end of the through-portion 314 penetrates the fifth surface S5 of the tip portion 412 to form the second opening H2 and a third opening H3. The first opening H1 and the second opening H2 have perpendicular directions. The first opening H1 and the third opening H3 have perpendicular directions. The second opening H2 and the third opening H3 have the same direction.

The first micro-antenna 331 is installed in the second opening H2, and the second micro-antenna 332 is installed in the third opening H3. The first micro-antenna 331 and the second micro-antenna 332 are separately electrically connected with the waveguide 320. The second opening H2 and the third opening H3 are arranged in a straight line parallel to a horizontal linking line of the first opening H1 to the second opening H2.

The detector device 400 can be used for not only detecting a single on-wafer antenna of the IC chip in each detecting process, but also for simultaneously detecting two on-wafer antennas of the IC chip in each detecting process.

Figure 5:
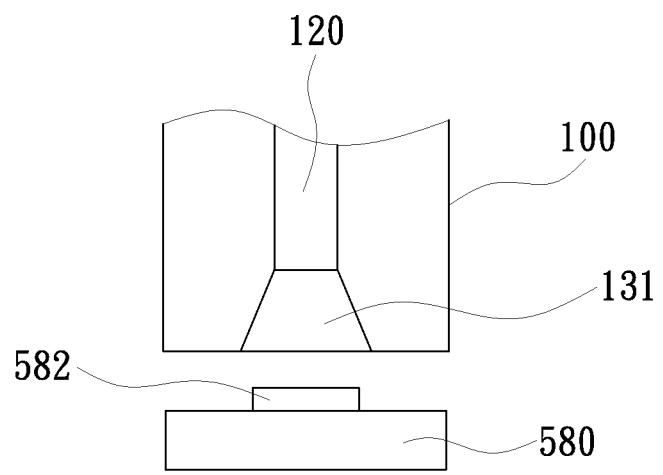
FIG. 5 is a schematic cross-sectional view illustrating an on-wafer antenna of an IC chip being detected by the detector device.

FIG. 5 is a schematic cross-sectional view illustrating an on-wafer antenna of an IC chip being detected by the detector device. According to an embodiment, as shown in FIG. 5, the detector device 100 with the single first micro-antenna 131 is used to detect a single on-wafer antenna 582 of an IC chip 580 in each detecting process. However, the detector device 100 can be replaced by the detector device 200, 300 or 400 to detect single on-wafer antenna or a plurality of on-wafer antennas of the IC chip in each detecting process. The invention is not limited to the embodiment shown in FIG. 5. During detection, the first micro-antenna 131 of the detector device 100 is placed over the on-wafer antenna 582 of the IC chip 580, and the detection is performed contactless in a short distance.

Figure 6:
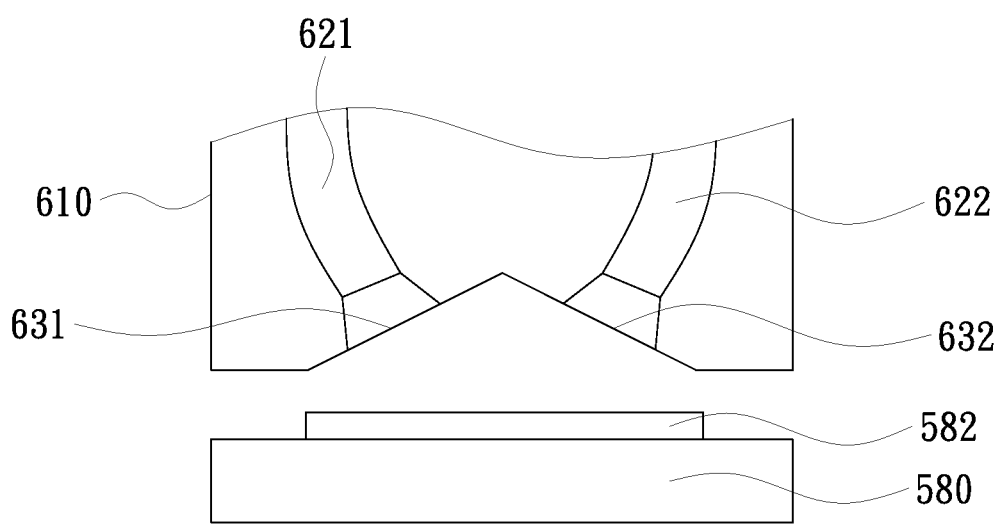
FIG. 6 is a schematic cross-sectional view illustrating an on-wafer antenna of an IC chip being detected by a detector device having a probe with two waveguides.
Figure 7:
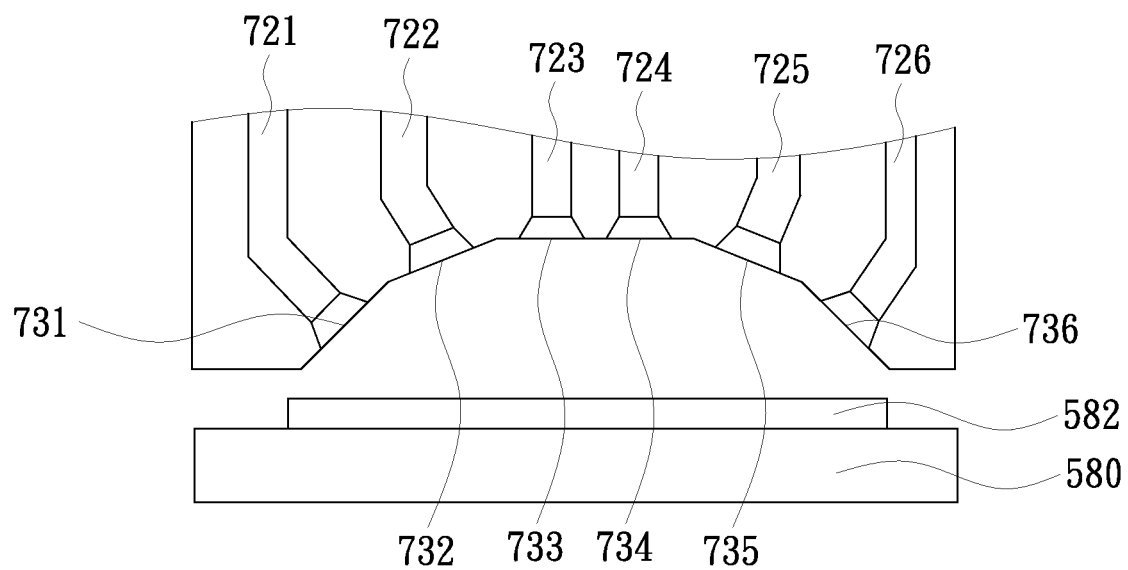
FIG. 7 is a schematic cross-sectional view illustrating an on-wafer antenna of an IC chip being detected by a detector device having a probe with six waveguides.

In each of the above-mentioned embodiments, the detector device having the probe with a single waveguide is used. According to other embodiments, detector devices having a probe with more than two waveguides are also provided. Please refer to FIG. 6, which is a schematic cross-sectional view illustrating an on-wafer antenna 582 of an IC chip 580 being detected by a detector device having a probe 610 with two waveguides 621, 622. The waveguide 621 is electrically connected to a micro-antenna 631, and the waveguide 622 is electrically connected to a micro-antenna 632. In addition, FIG. 7 is a schematic cross-sectional view illustrating an on-wafer antenna 582 of an IC chip 580 being detected by a detector device having a probe 710 with six waveguides 721, 722, 723, 724, 725, 726. The waveguides 721, 722, 723, 724, 725, 726 are electrically connected to micro-antennas 731, 732, 733, 734, 735, 736, respectively. Although in the embodiments shown in FIGS. 6 and 7 each waveguide is electrically connected with a single micro-antenna, each waveguide can also be electrically connected with two or more micro-antennas.

In addition, for the detector devices having a probe with a plurality of waveguides, there can be only one on-wafer antenna or more than one on-wafer antennas on the IC Chip being detected. That is to say, the correspondence relationship between IC Chip and antenna can be one-to-one, many-to-many, one-to-many or many-to-one.

It is worth mentioning that the detector devices 100, 200, 300, 400 according to the embodiment can be integrated in a conventional probe stage, so that a direction and a distance between the IC chips and the detector device can be adjusted and a process for detecting the on-wafer antennas of IC chips becomes easy.

In summary, the detector devices according to the embodiment have at least one micro-antenna installed in an opening of the tip portion of the probe. In this way, the detector devices according to the embodiment can be used for more closely detecting an on-wafer antenna of the IC chip, thus a relatively accurate measured data can be obtained. In addition, the detector devices according to the embodiment could be integrated in a conventional probe stage.

While the embodiment has been described in terms of what is presently considered to be the most practical and preferred embodiments, it is to be understood that the embodiment needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A detector device for functional certification comprising:
   a probe including a tip portion and a through-portion, wherein an end of the through-portion penetrates a first surface of the probe to form a first opening, and an opposite end of the through-portion penetrates the tip portion to form a second opening;
   a waveguide disposed in the through-portion; and
   a first micro-antenna installed in the second opening and electrically connected with the waveguide.

2. The detector device according to claim 1, wherein the first micro-antenna is a horn micro-antenna.

3. The detector device according to claim 2, wherein the probe further includes a second surface, wherein the first surface has a first edge and a second edge opposite to the first edge, the second surface has the second edge and a third edge opposite to the second edge, wherein the first edge is longer than the second edge, the second edge is longer than the third edge.

4. The detector device according to claim 3, wherein the probe further includes a third surface and a fourth surface, wherein the third surface and the second surface jointly have the third edge, and the third surface and the fourth surface jointly have the a fourth edge opposite to the third edge, wherein the first surface and the fourth surface have the same extending direction, and the third surface and the fourth surface are corporately formed as the tip portion.

5. The detector device according to claim 4, wherein the opposite end of the through-portion penetrates the fourth surface of the tip portion to form the second opening.

6. The detector device according to claim 1, further comprising a second micro-antenna electrically connected with the waveguide, wherein the opposite end of the through-portion further penetrates the tip portion to form a third opening, and the second micro-antenna is installed in the third opening.

7. The detector device according to claim 6, wherein the second opening and the third opening are arranged in a straight line, the straight line is parallel to a horizontal linking line of the first opening to the second opening.

8. The detector device according to claim 1, wherein the first opening and the second opening have mutually perpendicular directions.

9. The detector device according to claim 8, wherein the probe further includes a second surface and a third surface, wherein the first surface and the second surface jointly have the first edge, the second surface and the third surface jointly have the second edge opposite to the first edge, and the second edge is shorter than the first edge, the third surface further have a third edge opposite to the second edge, and the third edge is shorter than the second edge.

10. The detector device according to claim 9, wherein the probe further includes a fourth surface and a fifth surface, wherein the fourth surface and the third surface jointly have the third edge, and the fourth surface and the fifth surface jointly have a fourth edge opposite to the third edge, wherein the second surface and the fifth surface have the same extending direction, and the fourth surface and the fifth surface are corporately formed as the tip portion.

11. The detector device according to claim 10, wherein the opposite end of the through-portion penetrates the fifth surface of the tip portion to form the second opening.

12. A detector device for functional certification comprising:
  a probe including a tip portion and a through-portion, wherein an end of the through-portion penetrates a first surface of the probe to form a first opening, and an opposite end of the through-portion penetrates the tip portion to form a second opening, wherein the first opening and the second opening have opposite directions;
  a waveguide disposed in the through-portion; and
  a first horn micro-antenna installed in the second opening and electrically connected with the waveguide.

13. The detector device according to claim 12, wherein the probe further includes a second surface, wherein the first surface has a first edge and a second edge opposite to the first edge, the second surface has the second edge and a third edge opposite to the second edge, and the first surface and the second surface jointly have the second edge, wherein a the first edge is longer than the second edge, the second edge is longer than the third edge.

14. The detector device according to claim 13, wherein the probe further includes a third surface and a fourth surface, wherein the third surface and the second surface jointly have the third edge, and the third surface and the fourth surface jointly have a fourth edge opposite to the third edge, wherein the first surface and the fourth surface have the same extending direction, and the third surface and the fourth surface are corporately formed as the tip portion.

15. The detector device according to claim 14, wherein the opposite end of the through-portion penetrates the fourth surface of the tip portion to form the second opening.

16. The detector device according to claim 12, further comprising a second micro-antenna electrically connected with the waveguide, wherein the opposite end of the through-portion further penetrates the tip portion to form a third opening, and the second micro-antenna is installed in the third opening.

17. The detector device according to claim 16, wherein the second opening and the third opening are arranged along a first direction, the first direction is parallel to a horizontal connection line of an extending direction of the first opening to an extending direction of the second opening.

18. A detector device for functional certification comprising:
  a probe including a tip portion and a through-portion, wherein an end of the through-portion penetrates a first surface of the probe to form a first opening, and an opposite end of the through-portion penetrates the tip portion to form a second opening, wherein first opening and the second opening have mutually perpendicular directions;
  a waveguide disposed in the through-portion; and
  a first micro-antenna installed in the second opening and electrically connected with the waveguide.

19. The detector device according to claim 18, further comprising a second micro-antenna electrically connected with the waveguide, wherein the opposite end of the through-portion further penetrates the tip portion to form a third opening, and the second micro-antenna is installed in the third opening.

20. The detector device according to claim 19, wherein the second opening and the third opening are arranged along a first direction, the first direction is parallel to a horizontal connection line of an extending direction of the first opening to an extending direction of the second opening.

* * * * *